(12) United States Patent
Wu et al.

(10) Patent No.: US 11,882,666 B2
(45) Date of Patent: Jan. 23, 2024

(54) DISPLAY DEVICE

(71) Applicant: InnoLux Corporation, Miao-Li County (TW)

(72) Inventors: Yuan-Lin Wu, Miao-Li County (TW); Tsung-Han Tsai, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 25 days.

(21) Appl. No.: 17/567,167

(22) Filed: Jan. 3, 2022

(65) Prior Publication Data

US 2022/0264752 A1   Aug. 18, 2022

(30) Foreign Application Priority Data

Feb. 18, 2021 (CN) .......................... 202110187692.5

(51) Int. Cl.
| | |
|---|---|
| *H05K 5/00* | (2006.01) |
| *H05K 1/18* | (2006.01) |
| *H01L 25/16* | (2023.01) |
| *H10K 59/122* | (2023.01) |
| *H10K 102/00* | (2023.01) |

(52) U.S. Cl.
CPC ............ *H05K 5/0017* (2013.01); *H05K 1/18* (2013.01); *H01L 25/167* (2013.01); *H05K 2201/10128* (2013.01); *H10K 59/122* (2023.02); *H10K 2102/311* (2023.02)

(58) Field of Classification Search
CPC .. H05K 5/0017; H05K 1/18; H05K 2102/311; H05K 59/122
USPC ............... 361/752, 728, 796, 807, 809, 810
See application file for complete search history.

(56) References Cited

U.S. PATENT DOCUMENTS

| | | | |
|---|---|---|---|
| 2016/0081204 A1* | 3/2016 | Park .................... | G06F 1/1652 |
| | | | 361/807 |
| 2016/0202781 A1 | 7/2016 | Kim | |
| 2018/0102072 A1* | 4/2018 | Lee ..................... | G06F 3/147 |
| 2018/0103552 A1 | 4/2018 | Seo | |
| 2018/0145124 A1* | 5/2018 | Kim .................... | H10K 50/818 |
| 2020/0136066 A1* | 4/2020 | Jin ...................... | H10K 59/40 |
| 2021/0014982 A1* | 1/2021 | Bok ..................... | H05K 1/189 |
| 2021/0185835 A1* | 6/2021 | Song ................... | H05K 5/0017 |
| 2022/0416181 A1* | 12/2022 | Wu ...................... | H10K 59/122 |
| 2023/0046408 A1* | 2/2023 | Wu ...................... | H05K 5/0018 |

* cited by examiner

*Primary Examiner* — Hung S. Bui
(74) *Attorney, Agent, or Firm* — Winston Hsu (57) ABSTRACT

A display device includes a display panel which includes a rollable portion and a non-rollable portion. The non-rollable portion has two ends. One of the two ends is connected to the rollable portion, and the other of the two ends is connected to a circuit board.

14 Claims, 12 Drawing Sheets

DISPLAY DEVICE

BACKGROUND OF THE DISCLOSURE

1. Field of the Disclosure

The present disclosure generally relates to an electronic device. In particular, the present disclosure is directed to an electronic device including a rollable portion and a non-rollable portion.

2. Description of the Prior Art

In recent years, electronic devices or deformable electronic devices have become one of the focal points of the electronic technology of new generations. Therefore, the demand for flexible display devices that may be incorporated into electronic devices, such as rollable display devices, has also increased accordingly. A rollable display device may include an extendable screen of a stretchable display panel.

When a rollable display device is in operation, the extendable screen often needs to be unrolled and rolled repeatedly. Therefore, it is necessary to ensure that the signal input of the extendable screen is normal during the repeated extension and rolling process. If the signal input terminal is arranged in the rollable portion of the extendable screen, the signal input terminal is prone to be pulled to result in abnormal signal input when the extendable screen is extended or rolled. In addition, the stress in the bending region becomes overly large and the signal input is prone to be abnormal when the signal input terminal is disposed in a bending region of the extendable screen. Further, it is prone to cause the end to be squeezed by stress to result in abnormalities when the extendable screen is rolled if there is no bending part in the rollable portion after being extended (in an unrolled state).

If the signal input is abnormal during the repeated extension and rolling process of the extendable screen, it may increase the probability of display abnormality, thus the reliability of the display device is reduced. As consumers have higher and higher requirements for flexible display devices, it is one of the important issues for manufacturers to come up with a display device with higher reliability.

SUMMARY OF THE DISCLOSURE

According to some embodiments of the present disclosure, a display device including a display panel is provided. The display panel includes a rollable portion and a non-rollable portion. The non-rollable portion has two ends. One of the two ends is connected to the rollable portion, and the other end of the two ends is connected to a circuit board.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the touch display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function.

In addition, according to the embodiments of the present disclosure, an optical microscopy (OM), a scanning electron microscope (SEM), a film thickness profile measuring instrument (α-step), an ellipsometer or other suitable methods may be used to measure the thickness, width of each component or the distance between components. In detail, in some embodiments, after removing the liquid crystal layer, a scanning electron microscope may be used to obtain any cross-sectional image of a given structure, and the thickness, width, or distance between the elements in the image may be measured.

In the following description and in the claims, the terms "include", "comprise" and "have" are used in an open-ended fashion, and thus should be interpreted to mean "include, but not limited to".

When a component or a film layer is referred to as "disposed on another component or another film layer" or "electrically connected to another component or another film layer", it may mean that the component or film layer is directly disposed on another component or film layer, or directly connected to another component or film layer, or there may be other components or film layers in between. In contrast, when a component is said to be "directly disposed on another component or film" or "directly connected to another component or film", there is no component or film which inserts between the two.

The terms "generally", "about" or "substantially" generally mean within 20% of a given value or range, or mean within 10%, 5%, 3%, 2%, 1%, or 0.5% of a given value or range. That is to say, the meaning of "generally", "about" or "substantially" may still be implied without specific description of "generally", "about" or "substantially". In addition, the term "a range from the first value to the second value" means that the range includes the first value, the second value, and other values in between.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

The technical features in different embodiments described in the following may be replaced, recombined, or mixed with one another to constitute another embodiment without departing from the spirit of the present disclosure.

Figure 1A:
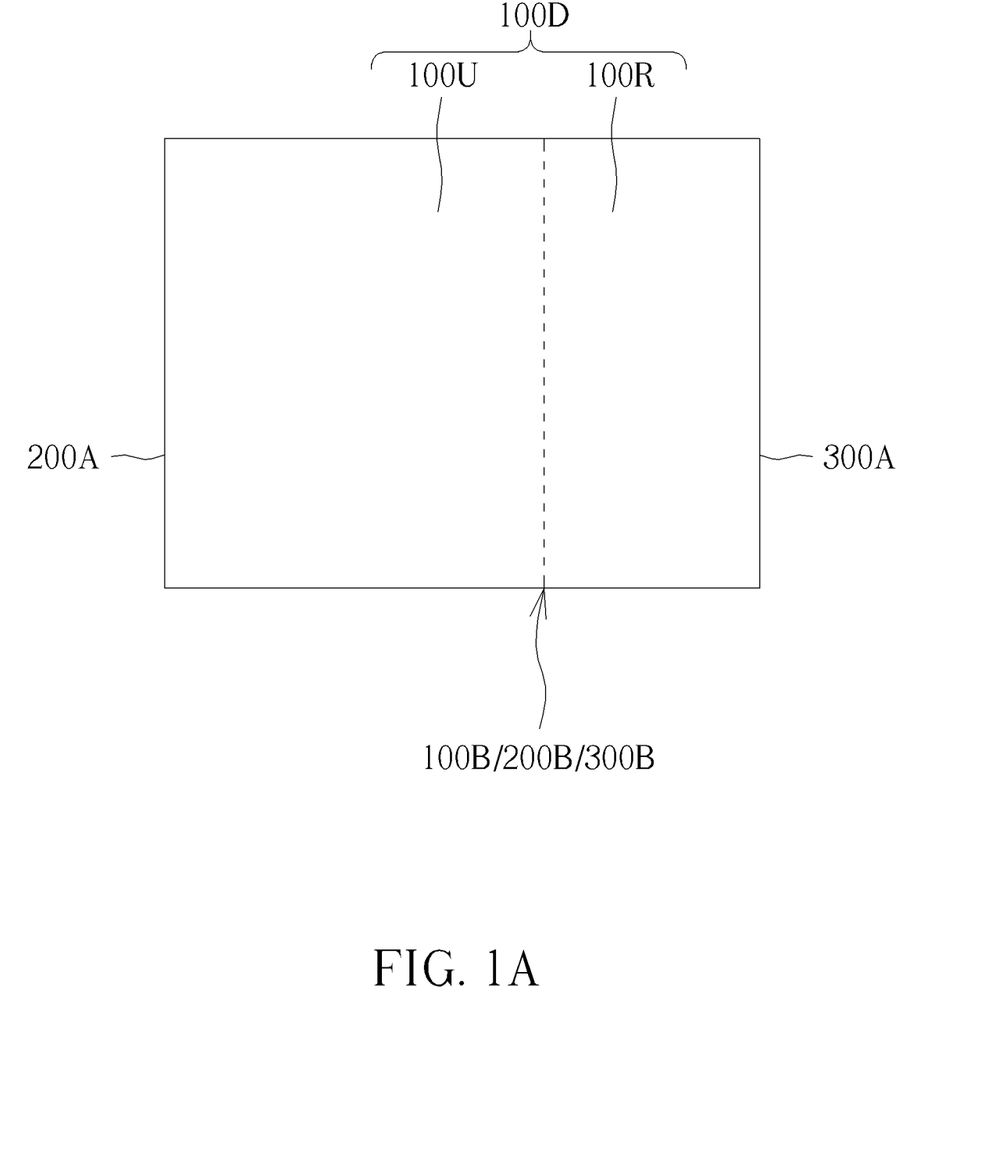
FIG. 1A is a schematic top view of a display device when it is unrolled according to the first embodiment of the present disclosure.
Figure 1B:
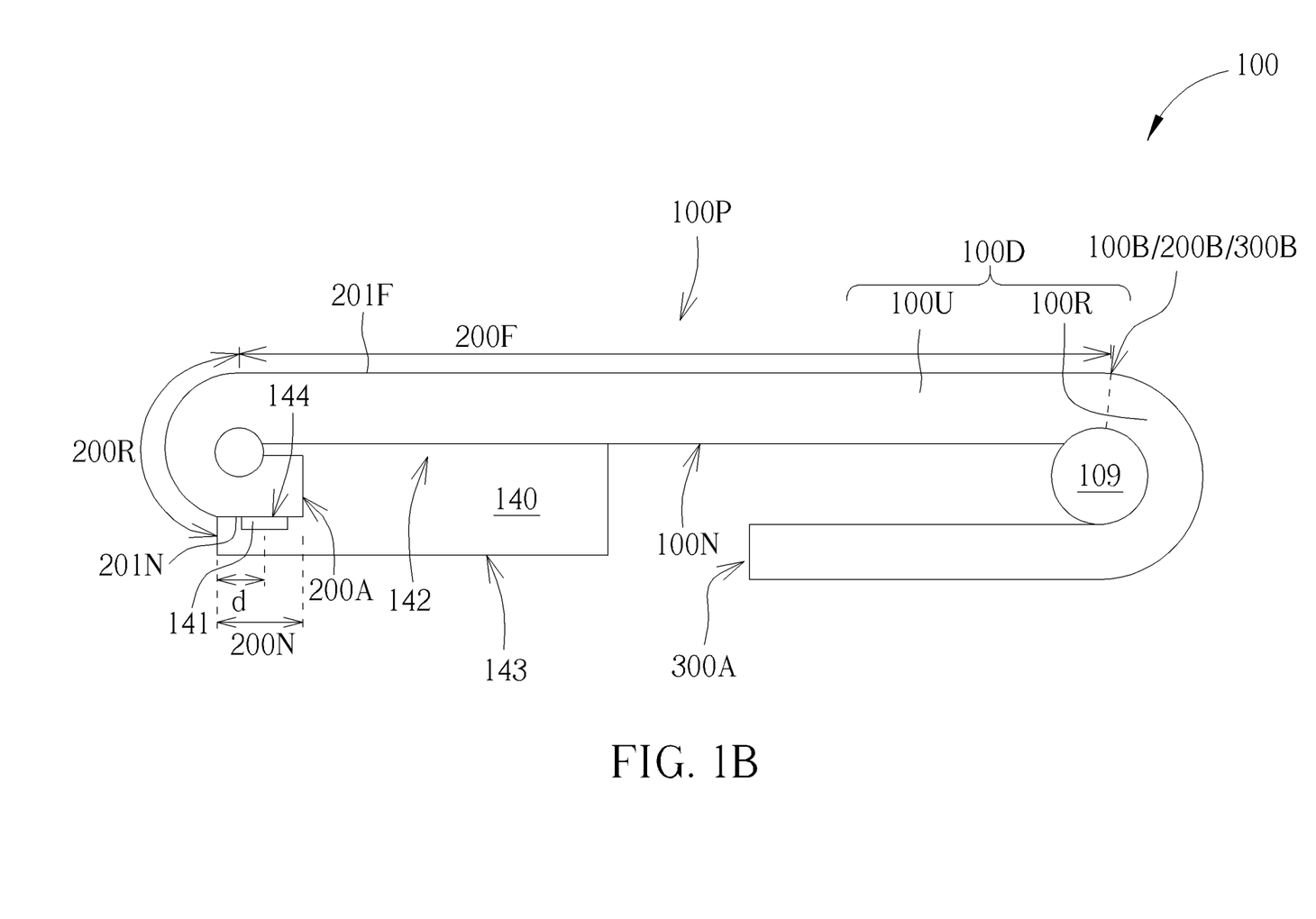
FIG. 1B is a schematic side view of a display device when it is rolled according to the first embodiment of the present disclosure.

FIG. 1A is a schematic top view of the display panel 100D of the display device when it is unrolled according to the first embodiment of the present disclosure, and FIG. 1B is a schematic side view of the display device 100 when it is rolled according to the first embodiment of the present disclosure. As shown in FIG. 1A, the display device of the first embodiment of the present disclosure may include a display panel 100D, for example (but not limited to) a rollable display panel or an expandable display panel, for example, an expandable display panel or a rollable display panel may be expanded or rolled with respect to a roller, but the present disclosure is not limited thereto. The display panel 100D may be a single panel or a splicing screen composed of one or more panels, but the present disclosure is not limited thereto. In this embodiment, FIG. 1A illustrates the display panel 100D in a fully unrolled state, revealing the left, right, upper, and lower sides of the display panel 100D. When the display panel 100D is applied to a display device, it may have at least one side which is bent toward the back side 100N (as shown in FIG. 1B). In addition, in some embodiments, the display panel 100D may have one side which is bent toward the backside and connected to a circuit board. The display panel 100D may include a rollable portion 100R and a non-rollable portion 100U. In some embodiments of the present disclosure, the rollable portion 100R may be a portion which is able to be rolled or unrolled by using a roller 109 (shown in FIG. 1B). Alternatively, it is also possible to respectively define the ranges of the non-rollable portion 100U and the rollable portion 100R by rolling the entire display panel 100D to a minimum size (for example, any one of length, width, or area). For example, the non-withdrawn part may be defined as the non-rollable portion 100U, and the withdrawn part may be defined as the rollable portion 100R when the display panel 100D is withdrawn to become the smallest in terms of size. In some embodiments, the border 100B may be marked to distinguish the non-rollable portion and the rollable portion when the display panel 100D is withdrawn to have the minimum size. For example, a pen or laser may be used to mark the border, but the present disclosure is not limited thereto.

Please refer to both FIGS. 1A and 1B. FIG. 1B illustrates a state where the display panel 100D shown in FIG. 1A is applied to the display device 100 and the rollable portion 100R is fully rolled. The display panel 100D has a front side 100P and a back side 100N, and the two sides are opposite to each other. In one embodiment, at least some of the front side 100P may have a display function, while the back side 100N may not have a display function. The non-rollable portion 100U may have two ends, one end 200B of the two ends is connected to the rollable portion 100R, and the other end 200A may be disposed far away from the rollable portion 100R and may be connected to a circuit board. The non-rollable portion 100U may include a second region 200F, a bending region 200R, and a first region 200N. The first region 200N is adjacent to the other end 200A of the aforementioned two ends. The bending region 200R may be disposed between the second region 200F and the first region 200N. The second region 200F in the non-rollable portion 100U is a region of a display function. In some embodiments, at least some of the bending region 200R may have a display function. On the other hand, the rollable portion 100R may have two ends. One end 300B may be connected to the non-rollable portion 100U, and the other end 300A may be an end disposed away from the non-rollable portion 100U. It should be noted that, in this embodiment, the border 100B disposed between the non-rollable portion 100U and the rollable portion 100R may be regarded as one end of the non-rollable portion 100U and/or of the rollable portion 100R (for example, 200B or 300B), but the present disclosure in not limited thereto. In other embodiments, when the display panel 100D is formed by splicing two panels, one of the panels may include the non-rollable portion 100U, and the other panel may include the rollable portion 100R, and the splicing line formed between the two panels may be regarded as the border 100B of the non-rollable portion 100U and the rollable portion 100R, in other words, the splicing line between the two panels may be regarded as one end of the non-rollable portion 100U and/or of the rollable portion 100R (for example 200B or 300B), but the present disclosure in not limited thereto. The display device 100 may further include an antenna device, a sensing device or a splicing device, but the present disclosure is not limited thereto. The antenna device may be, for example, a liquid crystal antenna. The splicing device may be, for example, a display splicing device or an antenna splicing device. It should be noted that the display device may be a combination of the above, but the present disclosure is not limited thereto.

In an embodiment, the non-rollable portion 100U may include a main display area on the display panel 100D, and the rollable portion 100R may include an extending display area on the display panel 100D, but the present disclosure in not limited thereto. The rollable portion 100R may not have image presentation in terms of the rolled state, but may have image presentation in terms of an unrolled state, but the present disclosure in not limited thereto. Therefore, a user may expand the rollable portion 100R when it is needed to assist the display function of the display device 100 according to usage requirements.

The non-rollable portion 100U may include a second region 200F, a bending region 200R, and a first region 200N. The bending region 200R may be a region disposed between the second region 200F and the first region 200N of the non-rollable portion 100U. The main display area may be disposed in the second region 200F. In some embodiments, the main display area may be further disposed in the second region 200F and in at least some of the bending region 200R, that is, the display area (main display area) when the display device is rolled to the smallest size may be disposed in the second region 200F of the non-rollable portion 100U, or also be provided in the second region 200F and in some of the bending region 200R, or may also be provided in the second region 200F and in the bending region 200R, but the present disclosure is not limited thereto.

In some embodiments, the bending region 200R may be defined by a horizontal line on the upper surface 201F of the second region 200F from the side view. The shortest distance between the horizontal line and the bending region 200R is not zero, and another horizontal line is formed on the upper surface 201N of the first region 200N. The shortest distance between the horizontal line and the bending region 200R is not zero, and the bending region 200R may be the region disposed between the aforementioned two horizontal lines.

It should be noted that, in this embodiment, the second region 200F may be generally flat. In some other embodiments, the second region 200F may be uneven and include an uneven surface or a curved surface. But compared to the bending region 200R, the second region 200F may be flatter. For example, the degree of the curvature of the second region 200F may be smaller than that of the bending region 200R, but the present disclosure is not limited thereto. In this embodiment, the first region 200N may be generally flat. In some embodiments, the first region 200N may be uneven and include an uneven surface or a curved surface. Compared with the bending region 200R, the first region 200N may be flatter. For example, the degree of the curvature of the first region 200N may be smaller than that of the bending region 200R, but the present disclosure is not limited thereto. In some embodiments, the first region 200N may be a region which is connected to the circuit board 140, and the first region 200N may not have a display function, but the present disclosure is not limited thereto.

The end 200B of the non-rollable portion 100U may be connected to the rollable portion 100R, and the end 200A may be connected to the circuit board 140. The rollable portion 100R may have two ends, that is, an end 300A and another end 300B, and the end 300B may be connected to the non-rollable portion 100U. In one embodiment, the circuit board 140 may be connected to the non-rollable portion 100U to serve as a signal input terminal of the display panel 100D to drive the rollable display panel 100D to generate a predetermined image. Since the display panel 100D of the display device 100 needs repeated rolling and unrolling, the non-rollable portion 100U may help the display panel 100D make the circuit board 140 less movable in the process of repeated extension or contracting if the signal input end is connected to the non-rollable portion 100U to maintain normal signal input. As shown in FIG. 1B, the circuit board 140 may include a first region 144 joined to the first region 200N of the non-rollable portion 100U. In some embodiments, the circuit board 140 may include a bonding pad 141, and the bonding pad 141 of the circuit board 140 may be disposed on the surface 201N of the first region 200N in the non-rollable portion 100U. In addition, in some embodiments, the circuit board 140 may have a second region 142 which may be optionally connected to the backside 100N of the display panel 100D.

Figure 2:
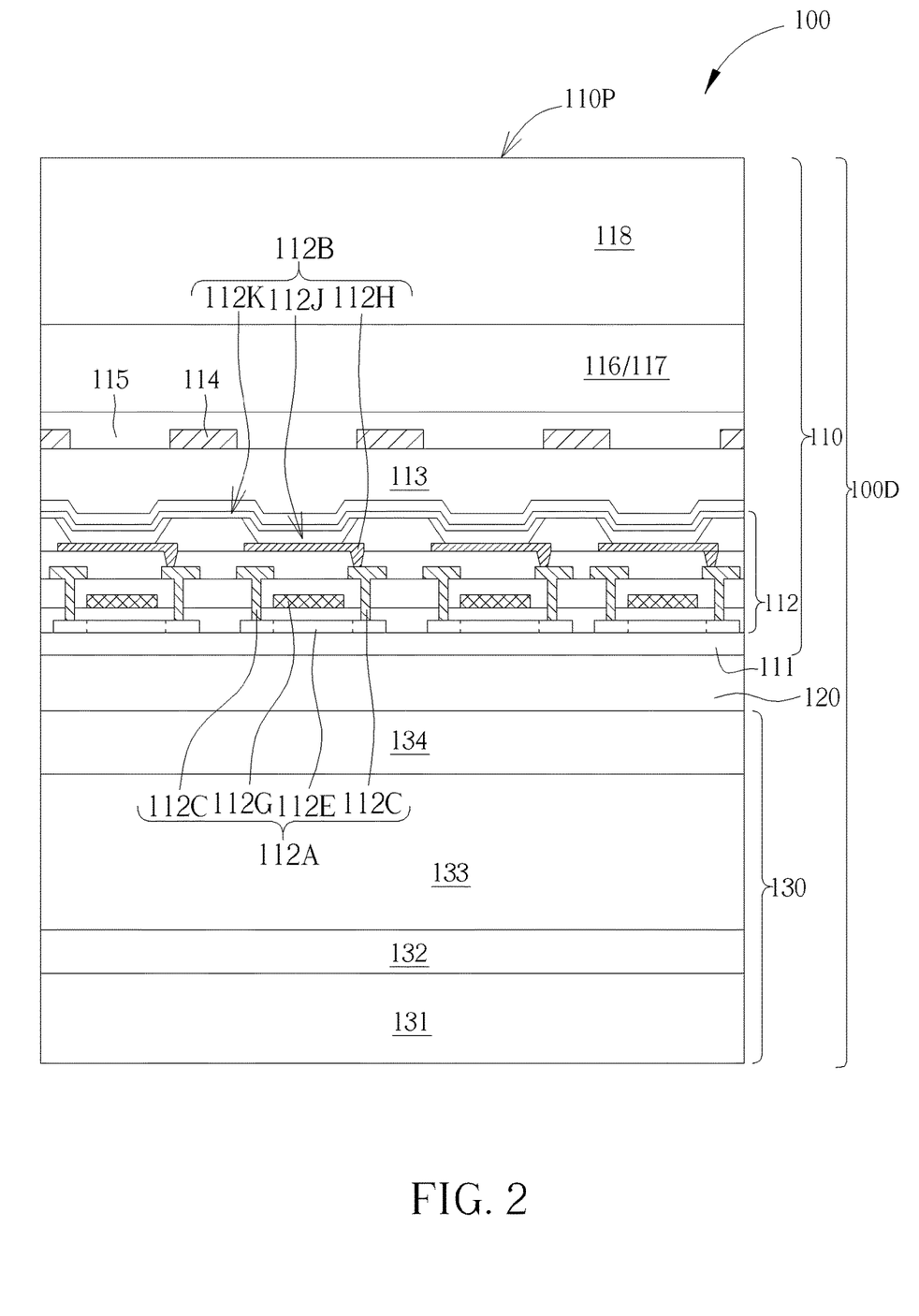
FIG. 2 is a schematic cross-sectional view of a display device according to the first embodiment of the present disclosure.
Figure 3:
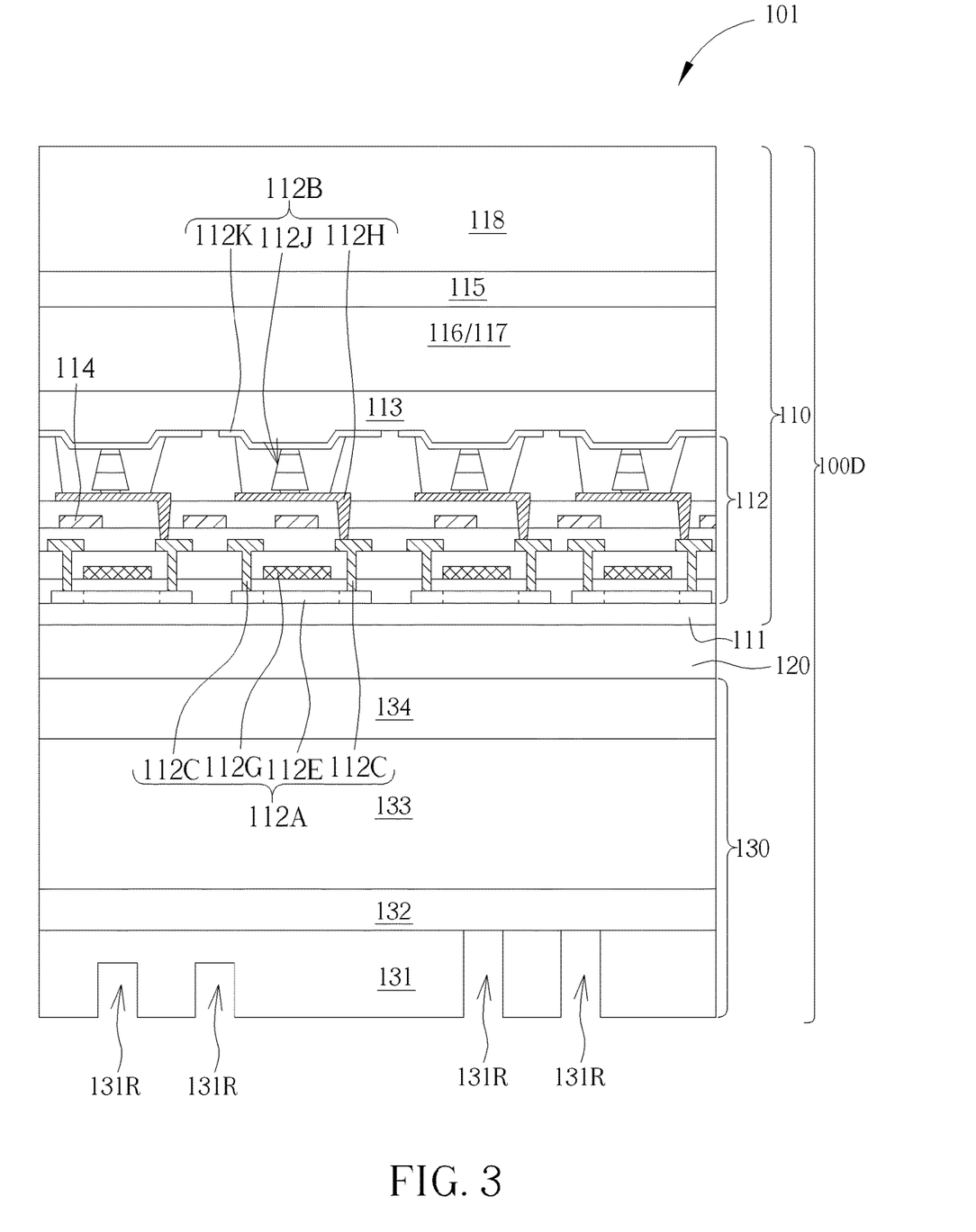
FIG. 3 is a schematic cross-sectional view of a display device according to a variant embodiment of the first embodiment of the present disclosure.

FIG. 2 is a schematic cross-sectional view of the display device 100 according to the first embodiment of the present disclosure. FIG. 3 is a schematic cross-sectional view of the display device 101 according to a variant embodiment of the first embodiment of the present disclosure. The display device 100 may include a display panel 100D. The display panel 100D may include a substrate 120, a display layer 110 and an optional supporting structure 130. The substrate 120 may be a single-layer structure or a multi-layer structure. The materials of the substrate 120 may be, for example, glass, polyimide (PI), polycarbonate (PC), polyethylene terephthalate (PET), any suitable material, or a combination of the above, but the present disclosure is not limited thereto. FIG. 2 or FIG. 3 shows that the display layer 110 may include at least one of a buffer layer 111, a light-emitting layer 112, an encapsulation layer 113, a touch layer 114, an optical adhesive layer 115, an optical layer 116, a color filter layer 117, and a cover plate 118. In other embodiments, the display layer 110 may optionally omit or add some elements or stacking layers, but the present disclosure is not limited thereto. Due to simplification, a single layer shown in the figures may actually be a multilayer structure. The display layer 110 may include, for example, liquid crystal, fluorescence, phosphor, light-emitting diodes, other suitable display media, or a combination of the above, but the present disclosure is not limited thereto. The buffer layer 111 may be disposed on the substrate 120 to serve as a buffer structure disposed between the light-emitting layer 112 and the substrate 120. For example, it may include silicon oxide, silicon nitride, or a combination of the above, but the present disclosure is not limited thereto.

The light-emitting layer 112 may be disposed on the buffer layer 111 and may include an active unit 112A and a light-emitting unit 112B. The active unit 112A may include, for example, a transistor, such as a thin film transistor, but the present disclosure in not limited thereto. The active cell 112A may include a source/drain 112C, a gate 112G, and a semiconductor 112E, and the gate 112G may be disposed on the semiconductor 112E. The light emitting unit 112B may include, for example, an organic light-emitting diode (OLED), a micro light-emitting diode (micro-LED), a sub-millimeter light-emitting diode (mini-LED), quantum dot LED (QDLED), but the present disclosure is not limited thereto. The light-emitting unit 112B may include, for example, a first electrode 112H, a display medium layer 112J, and at least some of the second electrode 112K. The first electrode 112H may be one of a cathode and an anode of the light-emitting unit 112B, and the second electrode 112K may be the other. The active unit 112A may correspond to the light-emitting unit 112B, and is electrically connected to the light-emitting unit 112B via the first electrode 112H to control display-related functions. To simplify the description, only one active unit 112A is shown in the figures, but the number of active units 112A may be optional for implementation. In some embodiments (not shown), the organic light emitting diode may, for example, include a hole injection layer (HIL), a hole transport layer (HTL), and a light emitting layer (EL), an electron transporting layer (ETL), an electron injection layer (EIL) and/or a charge generation layer (CGL), but the present disclosure is not limited thereto.

According to the embodiment of FIG. 2, the touch layer 114 may be disposed on the active unit 112A and/or the light-emitting unit 112B. According to the embodiment of FIG. 3, the touch layer 114 may be disposed between the active unit 112A and the light emitting unit 112B.

The encapsulation layer 113 may be disposed on the light-emitting layer 112 and have a function of protecting the light-emitting layer 112. The touch layer 114 may be disposed on the encapsulation layer 113 so that the display device 100 may have a touch function. The optical adhesive layer 115 may be disposed on the encapsulation layer 113 and the touch layer 114 (as shown in FIG. 2). In some embodiments, the optical adhesive layer 115 may be disposed on the optical layer 116 and the color filter layer 117 (as shown in FIG. 3). For example, the optical layer 116 and/or the color filter layer 117 may be attached to the display device 100 by means of the optical adhesive layer 115. In addition, the optical adhesive layer 115 may also include an insulating layer. The optical layer 116 may be disposed on the optical adhesive layer 115. The optical layer 116 may be a polarizing material layer, an anti-reflective material layer or a combination thereof, but the present disclosure is not limited thereto. For example, the optical layer 116 may be, for example, a polarizing plate or a polarizing layer, but the present disclosure is not limited thereto. The color filter layer 117 may be disposed on the optical adhesive layer 115 and may be disposed corresponding to the light-emitting element to be beneficial for the light-emitting element to emit substantially monochromatic light. The cover plate 118 may be disposed on the light-emitting layer, the encapsulation layer, and the touch layer to have a function of protecting the display panel 100D.

The supporting structure 130 may be disposed on the backside 100N of the display panel 100D (as shown in FIG. 1B), and may be used to support the display layer 110. The supporting structure 130 may be a single-layer structure or a multiple-layer structure according to design requirements. The supporting structure 130 may provide rigidity requirements for different parts of the display panel 100D (including the rollable portion 100R and the non-rollable portion 100U), so that the rollable portion 100R of the display panel 100D may withstand multiple rolling, unrolling and stretching, thereby reducing the chance of permanent deformation of the display panel 100D. The supporting structure 130 may include, for example, a supporting plate 131, a supporting structure glue 132, a supporting film 133, and a supporting film glue 134, but the present disclosure is not limited thereto. In other embodiments, the supporting structure 130 may omit some elements or stacking layers as needed. The supporting plate 131 may include a supporting plate material, and the materials of the supporting plate 131 may be, for example, a metal or an alloy, such as a copperplate or a stainless steel plate, but the present disclosure is not limited thereto. In some embodiments, the supporting plate 131 may be a heat sink plate. The supporting structure glue 132 may help the supporting plate 131 attached to the supporting film 133. The thickness of the supporting structure glue 132 may have a range from 50 μm to 200 μm (50 μm≤thickness≤200 μm), such as 80 μm, 100 μm, 130 μm, 150 μm, 180 μm, but the present disclosure is not limited thereto. The supporting film 133 may include a supporting plate material, and the supporting plate material may be a polymer, such as polyimide or polyethylene terephthalate, but the present disclosure is not limited thereto. The supporting film glue 134 may help the supporting film 133 attached to the substrate 120 to improve the overall rigidity of the rollable display panel 100D. The thickness of the supporting film 134 may have a range from 50 μm to 200 μm (50 μm≤thickness≤200 μm), such as 80 μm, 100 μm, 130 μm, 150 μm, 180 μm, but the present disclosure is not limited thereto.

FIG. 3 is a schematic cross-sectional view of the display device 101 according to a variant embodiment of the first embodiment of the present disclosure. The display device 101 of FIG. 3 may include a rollable display panel 100D. The differences between the rollable display panel 100D of FIG. 3 and the rollable display panel 100D of FIG. 2 mainly lie in the differences of the light-emitting layer 112, the position of the touch layer 114, the position of the optical adhesive layer 115, the differences of the optical layer 116, and the differences of the optional supporting structure 130. Due to simplification, a single layer shown in the figures may actually be a multilayer structure. The light-emitting layer 112 in FIG. 3 shows a mini light-emitting diode, and the optical adhesive layer 115 may be disposed between the optical layer 116 and the cover plate 118 so that the cover plate 118 may be attached to the optical layer 116. The supporting structure 130 of FIG. 3 may further include a groove 131R. The groove 131R may or may not optionally expose the supporting structure glue 132. In other words, the depth of the groove 131R may be smaller than the thickness of the supporting plate, or may also be substantially equal to the thickness of the supporting plate 131, but the present disclosure is not limited thereto.

The display devices of the present disclosure are not limited to the above-mentioned embodiments. Other embodiments of the present disclosure are disclosed as follows. In order to simplify the description and highlight the differences between the embodiments, the same reference numerals are used to label the same elements in the following, and the similar descriptions are not elaborated again. In addition, please refer to the foregoing embodiments for the materials of each film layer or element in the subsequent embodiments, and therefore they are not elaborated again.

Figure 4:
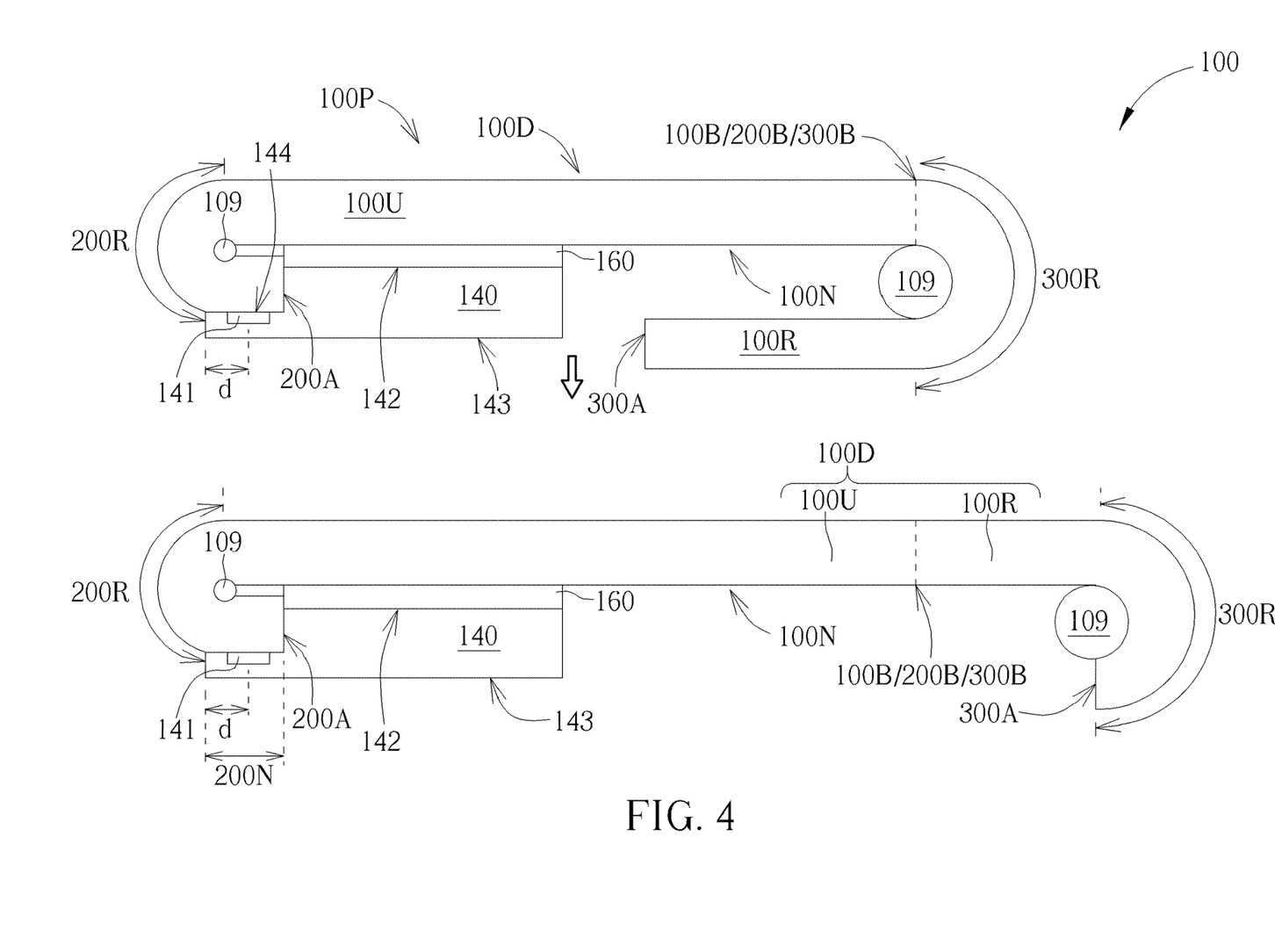
FIG. 4 is a schematic side view of a display device when it is rolled, unrolled or extended according to the second embodiment of the present disclosure.

FIG. 4 is a schematic side view of the display device 100 when it is rolled, extended or unrolled according to the second embodiment of the present disclosure. The upper part of FIG. 4 shows a schematic diagram of the display device 100 being rolled to the minimum, and includes the rollable portion 100R of the bending region 300R rolled to the non-display side 100N. Please refer to FIG. 1B for the detailed structures and the relative relationship of the elements, and they are not elaborated again. On the other hand, for example, a user needs to browse a larger window, a user needs to browse a larger image, or a user needs to browse another window without changing the original size of the window when the user needs to browse a larger display area. The rollable portion 100R may be unrolled, as shown by the hollow arrow, to obtain the display state in the lower part of FIG. 4, so that the display device 100 may have a larger display area. The lower part of FIG. 4 shows a schematic diagram of the display device 100 being unrolled to the maximum. When the rollable portion 100R is unrolled, the display area on the rollable portion 100R may be combined with the display area of the non-rollable portion 100U to have a larger display region, and together to have a larger display area to be conducive to meet the user's demand for a large display area on the display side 100P of the display panel 100D. In some embodiments, the circuit board 140 may be fixed to the non-display side 100N of the display panel 100D by the adhesive layer 160 disposed in the second region 142, but the present disclosure is not limited thereto. In this embodiment, the components (not shown) in the circuit board 140 may be arranged on the component side 143 away from the second region 142, so the arrangement may facilitate the heat dissipation of the components in the circuit board 140 and help reduce the probability of abnormality of the display panel 100D so the reliability of the display device 100 may be increased. The thickness of the adhesive layer 160 may have a range from 50 μm to 500 μm (50 μm≤thickness≤500 μm), such as 100 μm, 200 μm, 300 μm, 400 μm, but the present disclosure is not limited thereto.

In some embodiments, the bonding pad 141 may be disposed on the first region 200N of the non-rollable portion 100U. Because the first region 200N of the non-rollable portion 100U is closer to the bending region 200R, the stress in the first region 200N of the non-rollable portion 100U is relatively high. The bonding pad 141 arranged at the first region 200N of the non-rollable portion 100U with greater stress or at the first region 200N near the non-rollable portion 100U with greater stress may make the bonding pad 141 more likely crack or fall off. Therefore, the bonding pad 141 may keep a proper distance from the bending region 200R, so that the bonding pad 141 may be disposed far away from the bending region 200R with larger stress. As shown in FIG. 4, there may be a distance d between the bonding pad 141 and the bending region 200R. The definition of the distance d may be viewed from a cross-sectional or side view, i.e. the shortest distance from the center point of the bonding pad 141 to the border of the bending region 200R and the first region 200N of the non-rollable portion 100U. For example, the distance d may not be less than 1000 μm (1000 μm≤d), but the present disclosure is not limited thereto.

Figure 5:
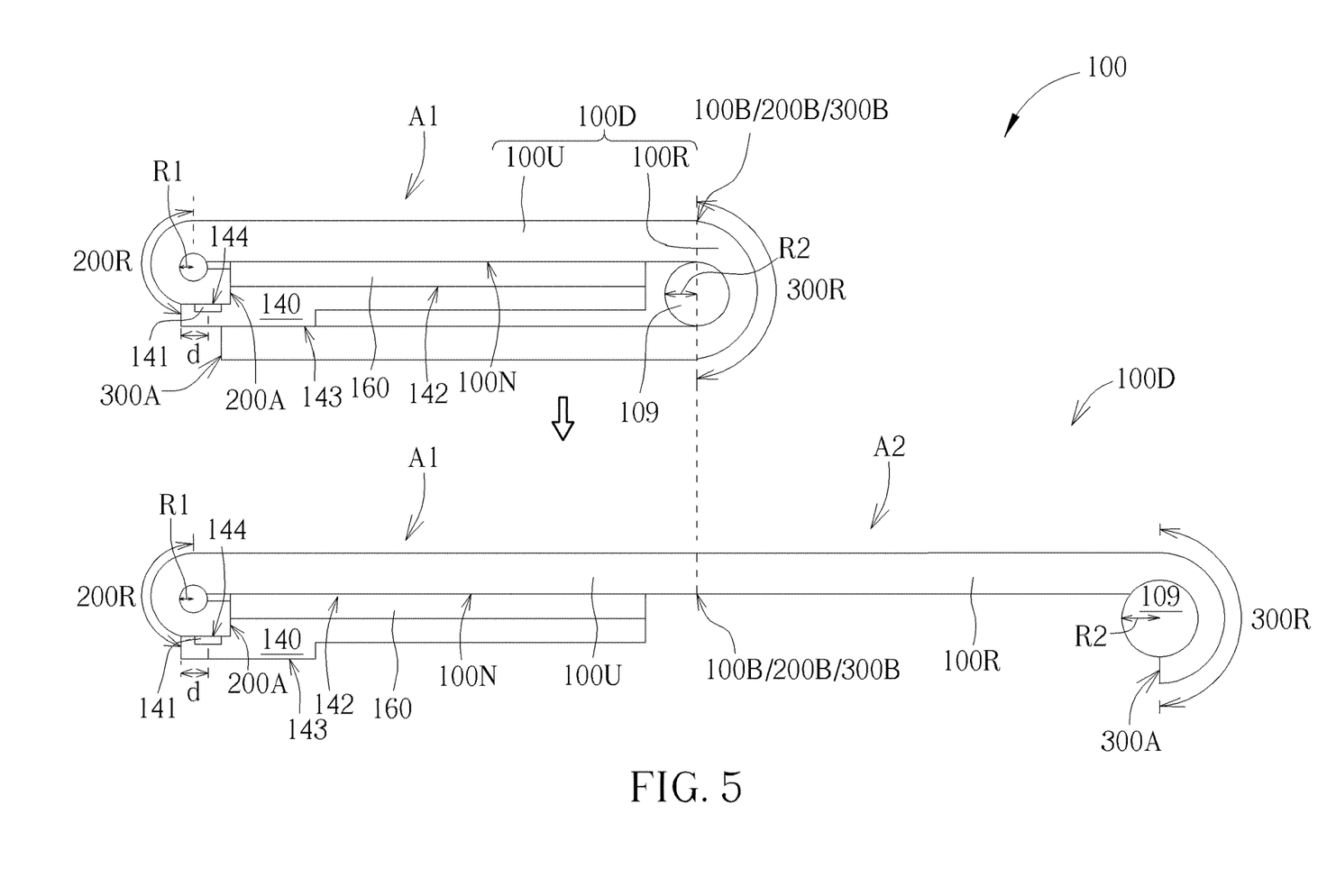
FIG. 5 is a schematic side view of a display device when it is rolled, unrolled or extended according to the third embodiment of the present disclosure.

FIG. 5 is a schematic side view of the display device 100 when it is rolled or unrolled according to the third embodiment of the present disclosure. The upper part of FIG. 5 shows a schematic diagram of the display device 100 being rolled to the minimum, and the rollable portion 100R is rolled to the non-display side 100N. In this embodiment, one end 300A of the rollable portion 100R may be in contact with the circuit board 140 when the rollable portion 100R is rolled, and one end 300A of the rollable portion 100R may be disposed away from the circuit board 140 as shown by the hollow arrow, when the rollable portion 100R is unrolled. The lower part of FIG. 5 shows a schematic diagram of the display device 100 unrolled to the maximum. The display area of the rollable portion 100R may be combined with the display area of the non-rollable portion 100U to have a larger display area when the rollable portion 100R is unrolled. In addition, the design of extending toward the circuit board 140 may reduce the wrinkles of the rollable portion 100R and reduce the chance of damages to the rollable portion 100R during repeated unrolling and rolling after one end 300A of the rollable portion 100R is bent. In this embodiment, when the rollable portion 100R is unrolled so that the display region has the largest display area, some of the rollable portion 100R surrounds the bending region 300R of the roller 109. The bending region 300R with a large radius of curvature facilitates the repeated unrolling and rolling of the rollable portion 100R, or reduces the compression stress of the end 300A, and further increases the reliability of the rollable display device 100.

In some embodiments, the radius of curvature of the bending region 200R of the non-rollable portion 100U and the radius of curvature of the bending region 300R of the rollable portion 100R may be substantially similar or different. In some embodiments, the radius of curvature of the roller adjacent to the non-rollable portion 100U may be regarded as the radius of curvature of the non-rollable portion 100U, and the radius of curvature of the roller adjacent to the rollable portion 100R may be regarded as the radius of curvature of the rollable portion 100R, but the present disclosure in not limited thereto. In some embodiments, the radius of curvature of the bending region 200R of the non-rollable portion 100U may be smaller than the radius of curvature of the bending region 300R of the rollable portion 100R, but the present disclosure is not limited thereto. In other embodiments, the radius of curvature of the bending region 200R of the non-rollable portion 100U may be close to or equal to the radius of curvature of the bending region 300R of the rollable portion 100R. For example, the ratio (R2/R1) of the curvature radius R1 of the bending region 200R of the non-rollable portion 100U to the curvature radius R2 of the bending region 300R of the rollable portion 100R may be in the range from greater than or equal to 1 to less than or equal to 50 (1 ratio 50), but the present disclosure is not limited thereto. The radius of curvature R2 of the rollable portion 100R larger than the radius of curvature R1 of the non-rollable portion 100U is beneficial to improve the reliability of the rollable portion 100R during the repeated unrolling and rolling process.

In some embodiments, the size (for example, width or area) of the display area of the non-rollable portion 100U and the display area of the rollable portion 100R may be similar or different. In some embodiments, the size of the display area of the non-rollable portion 100U may be larger than the size of the display area of the rollable portion 100R, but the present disclosure is not limited thereto. In other embodiments, the size of the display area of the non-rollable portion 100U may be substantially equal to the size of the display area of the rollable portion 100R. For example, the ratio (A2/A1) of the size A1 of the display area of the non-rollable portion 100U to the size A2 of the display area of the rollable portion 100R may be in a range from greater than or equal to 0.4 to less than or equal to 1 (0.4≤A2/A1≤1), but the present disclosure is not limited thereto. When the display device 100D is expanded to the maximum, if the size A2 of the display area of the rollable portion 100R and the size A1 of the display area of the non-rollable portion 100U are greater than 1 (1≤A2/A1), the rollable portion 100R is prone to bend downward or be inclined. When the user uses it, the display area of the rollable portion 100R and the display area of the non-rollable portion 100U may be respectively fall on different planes, and may be not conducive to the performance of the display effect.

Figure 6:
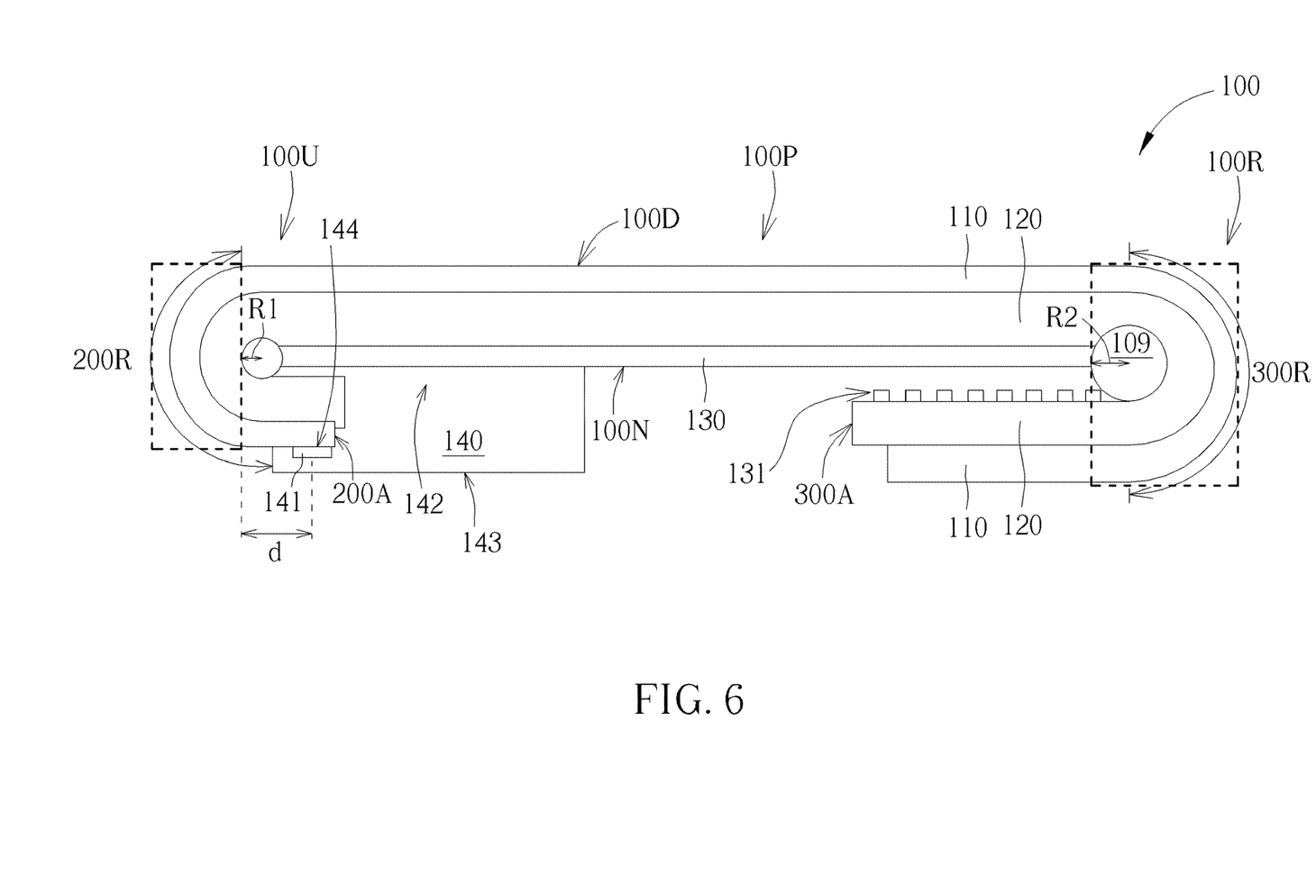
FIG. 6 is a schematic side view of a display device when it is rolled according to the fourth embodiment of the present disclosure.
Figure 7:
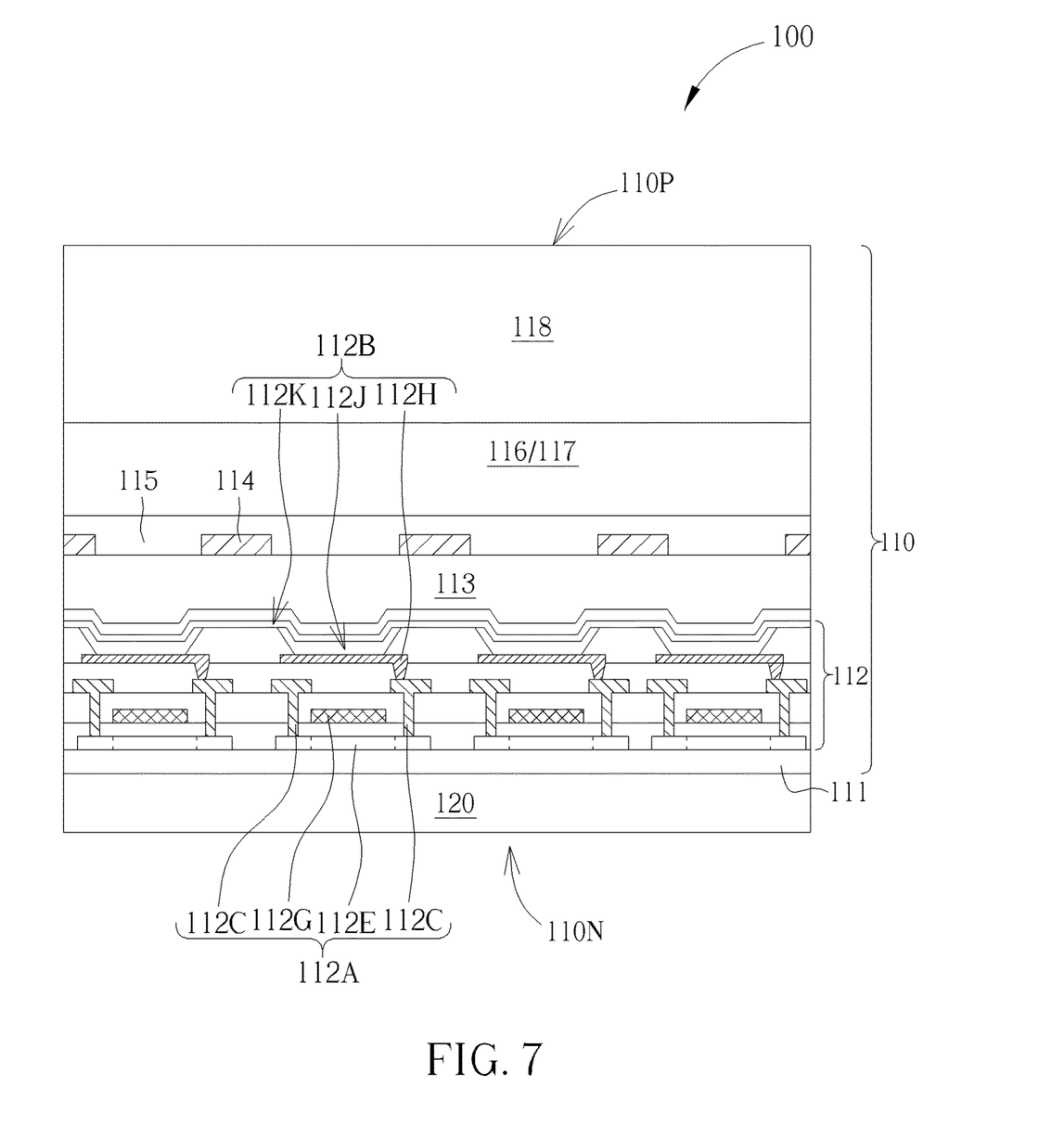
FIG. 7 is an enlarged cross-sectional view of the bending region of the non-rollable portion corresponding to FIG. 6.

FIG. 6 is a schematic side view of the display device 100 when it is rolled according to the fourth embodiment of the present disclosure. FIG. 7 is an enlarged cross-sectional view of the bending region 200R corresponding to the non-rollable portion 100U of FIG. 6. Please refer to FIG. 2 together with FIG. 6 and FIG. 7. According to the display device 100 of the fourth embodiment of the present disclosure, the supporting structure 130 of the bending region 200R of the non-rollable portion 100U and the supporting structure 130 of the bending region 300R of the rollable portion 100R may be similar or different. In some embodiments, the supporting structure 130 in the bending region (200R or 300R) may be omitted. For example, the supporting structure 130 of the bending region 200R of the non-rollable portion 100U may be thinner relative to the second region 200F of the non-rollable portion 100U, or the supporting plate 131 and/or the supporting film 133 may be omitted, or as shown in FIG. 7 the supporting structure 130 may be further omitted, so that the bending region 200R may maintain a smaller radius of curvature R1. Because the bending region 200R is disposed in the non-rollable portion 100U, there is no need to change the shape of the bending region 200R, so the bending region 200R may be thinner or the supporting structure 130 which strengthens the display layer 110 may be omitted. In addition, in some embodiments, the rigidity of the bending region 200R may be greater than the rigidity of the bending region 300R.

In some embodiments, the bending region 300R may keep the supporting structure 130 supporting the rollable portion 100U to reduce wrinkles or poor contact during repeated rolling and unrolling of the circuits, and improve the accuracy of signal input or output, or improve the service life of the display device 100 with an extendable display area, or increase the reliability of the rollable display device. In some embodiments, the supporting structure 130 of the rollable portion 100R may be as shown in FIG. 3 to further include a groove 131R. The design of the grooves 131R of the supporting structure 130 may increase the flexibility of the supporting structure 130 to facilitate repeated unrolling and rolling of the rollable portion 100R. In addition, in some embodiments, the supporting structure 130 of the rollable portion 100R may have a smaller thickness than that of the second region 200F of the non-rollable portion.

Figure 8:
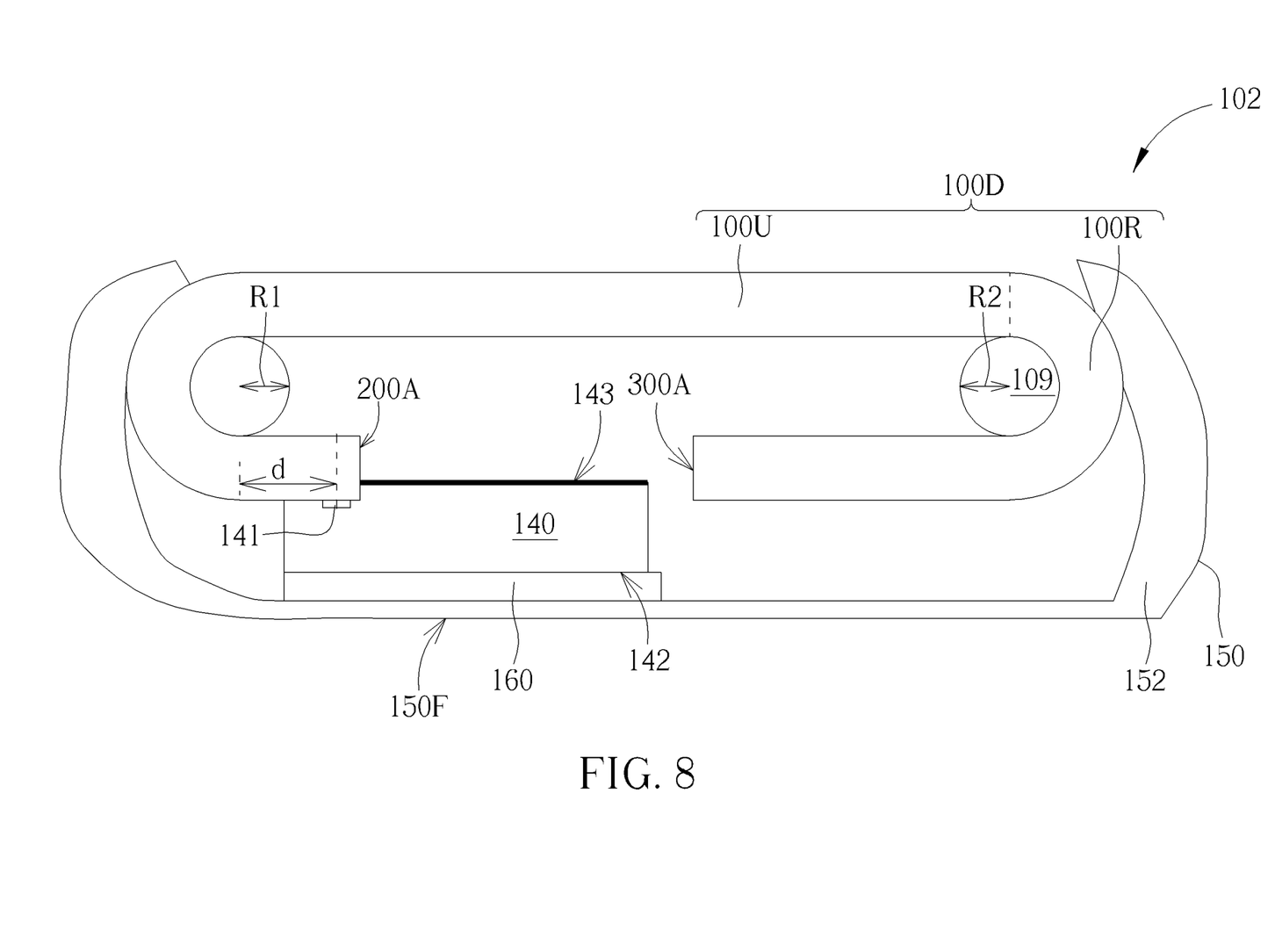
FIG. 8 is a schematic cross-sectional view of a display device when it is rolled according to the fifth embodiment of the present disclosure.

FIG. 8 is a schematic cross-sectional view of the display device 102 when it is rolled according to the fifth embodiment of the present disclosure. Please refer to FIG. 4 along with FIG. 8. The display device 102 according to the fifth embodiment of the present disclosure may further include a housing 150. The housing 150 may have a bottom 150F and a side wall 152 to form an accommodating space for the accommodation of the display panel 100D and of the circuit board 140 to facilitate their protection, storage or carrying of the display panel 100D and of the circuit board 140. When the display device 102 is unrolled, the housing 150 may be stretched out as well to keep the display panel 100D accommodated in the housing 150. If the display device is not fixed to the circuit board 140, the display panel 100D is likely to shake and wear during the process of stretching or rolling the display panel 100D. If the circuit board 140 is fixed onto the back of the display panel 100D, such as the non-display side 100N (for example shown in FIG. 4), or fixed on the housing 150 (for example shown in FIG. 8), it is beneficial to reduce the chance of abnormal signal input, but the present disclosure is not limited thereto.

In some embodiments, as shown in FIG. 8, the bonding pad 141 of the circuit board 140 may be closer to the end 200A of the non-rollable portion 100U and fixed to the second region 142 of the housing 150. For example, the circuit board 140 may be fixed in the housing 150 by means of the adhesive layer 160 which is disposed in the second region 142, but the present disclosure is not limited thereto. The fixed circuit board 140 is less prone to scratch the display panel 100D during the process of stretching or rolling the display panel 100D. In some embodiments, the position of the signal input end of the display panel 100D may be fixed on the non-display side 100N of the non-rollable portion 100U (as shown in FIG. 1B). For example, the circuit board 140 may be fixed to the non-display side 100N of the non-rollable portion 100U by means of the adhesive layer 160, but the present disclosure is not limited thereto. The thickness of the adhesive layer 160 may have a range from 50 μm to 500 μm (50 μm≤thickness≤500 μm), such as 100 μm, 200 μm, 300 μm, 400 μm, but the present disclosure is not limited thereto.

Figure 9A:
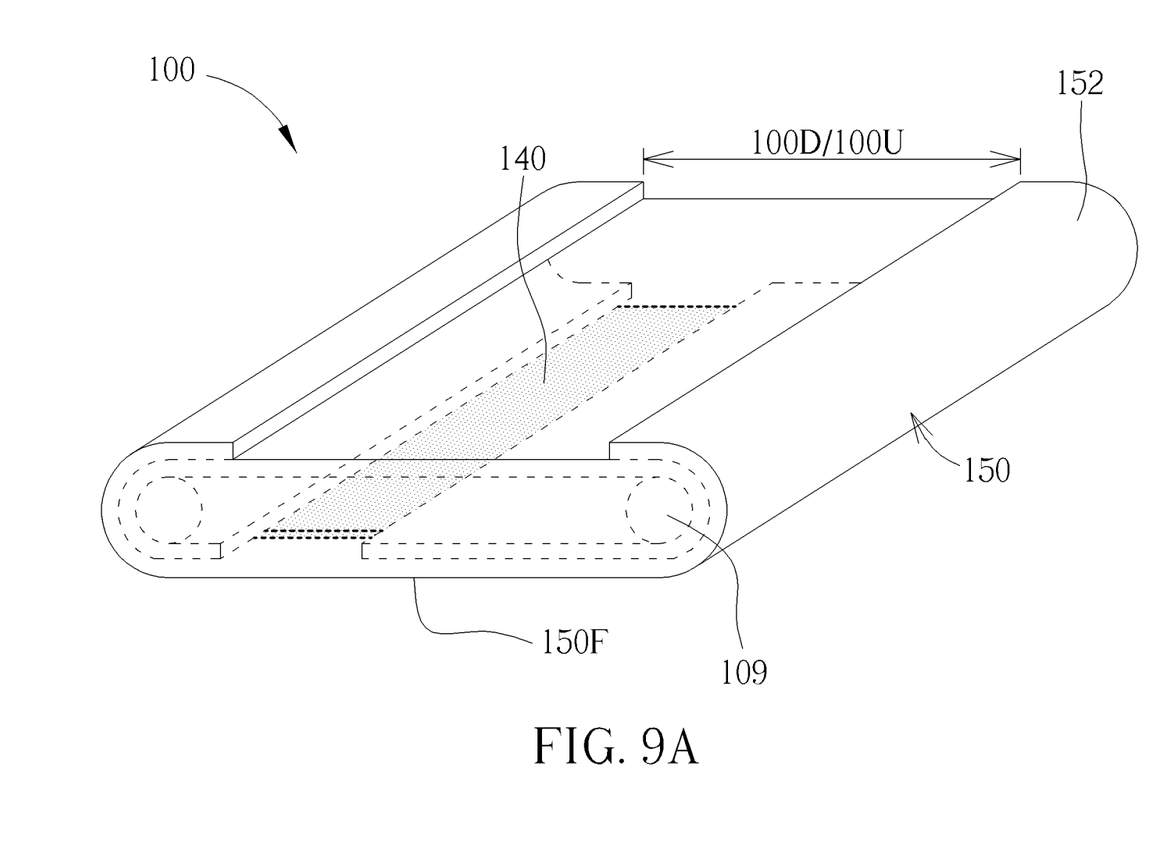
FIG. 9A is a schematic diagram of a variant embodiment of a display device according to the sixth embodiment of the present disclosure.
Figure 9B:
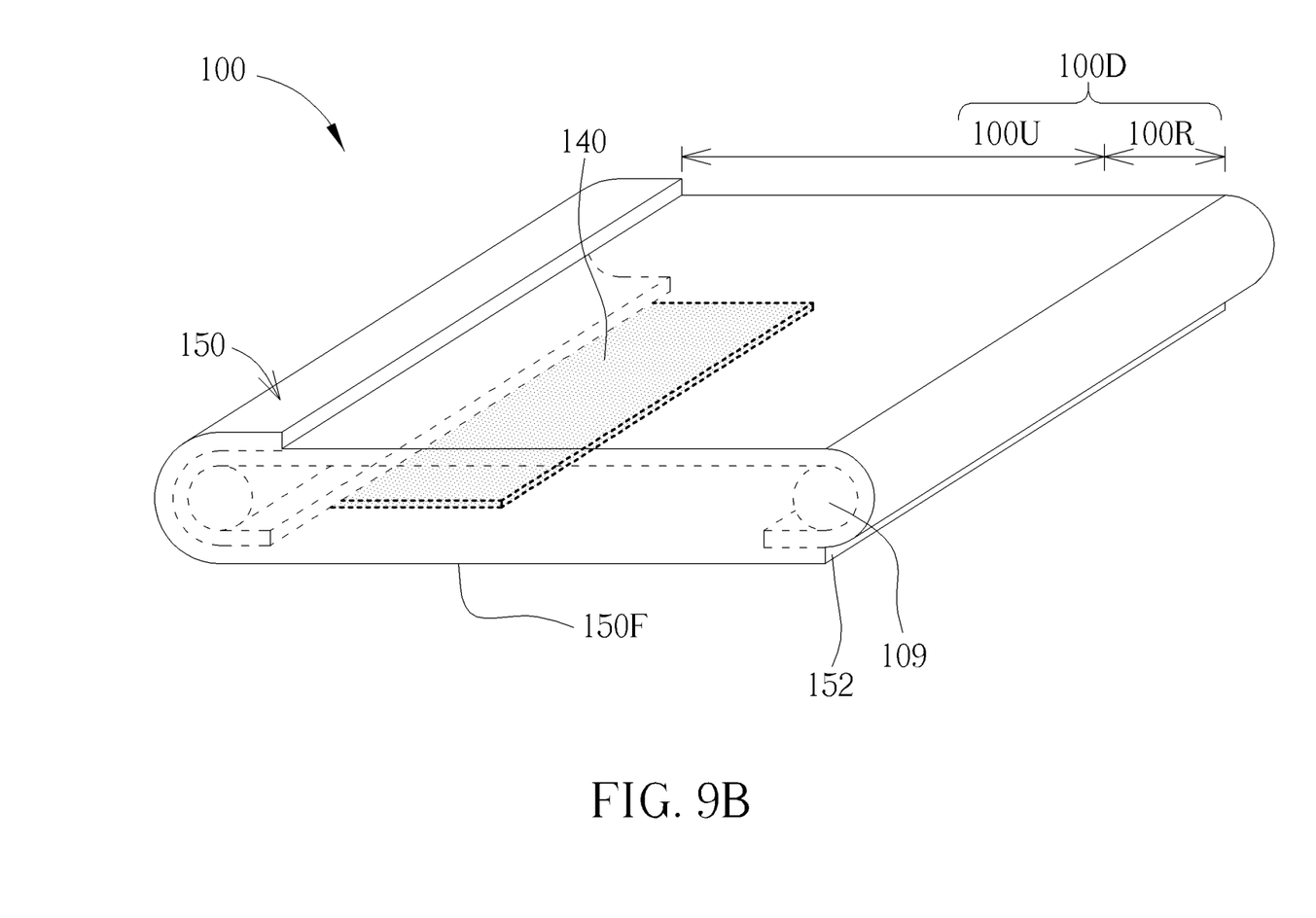
FIG. 9B is a schematic diagram of a variant embodiment of a display device according to the sixth embodiment of the present disclosure.

FIG. 9A and FIG. 9B are schematic diagrams of some variant embodiments of the display device 100 according to the sixth embodiment of the present disclosure. In some embodiments, for example, as shown in FIG. 9A, the size of the display panel 100D may become smaller, and the housing 150 may be correspondingly reduced in size to accommodate the non-rollable portion 100U of the display panel 100D when the display panel 100D is rolled. Similarly, for example, as shown in FIG. 9B, the size of the display panel 100D becomes larger, and the size of the housing 150 correspondingly becomes larger to accommodate the non-rollable portion 100U and the rollable portion 100R of the display panel when the display panel 100D is unrolled, in other words, the housing 150 may be an accommodating structure that may be deformed corresponding to the size of the display panel 100D.

Figure 10:
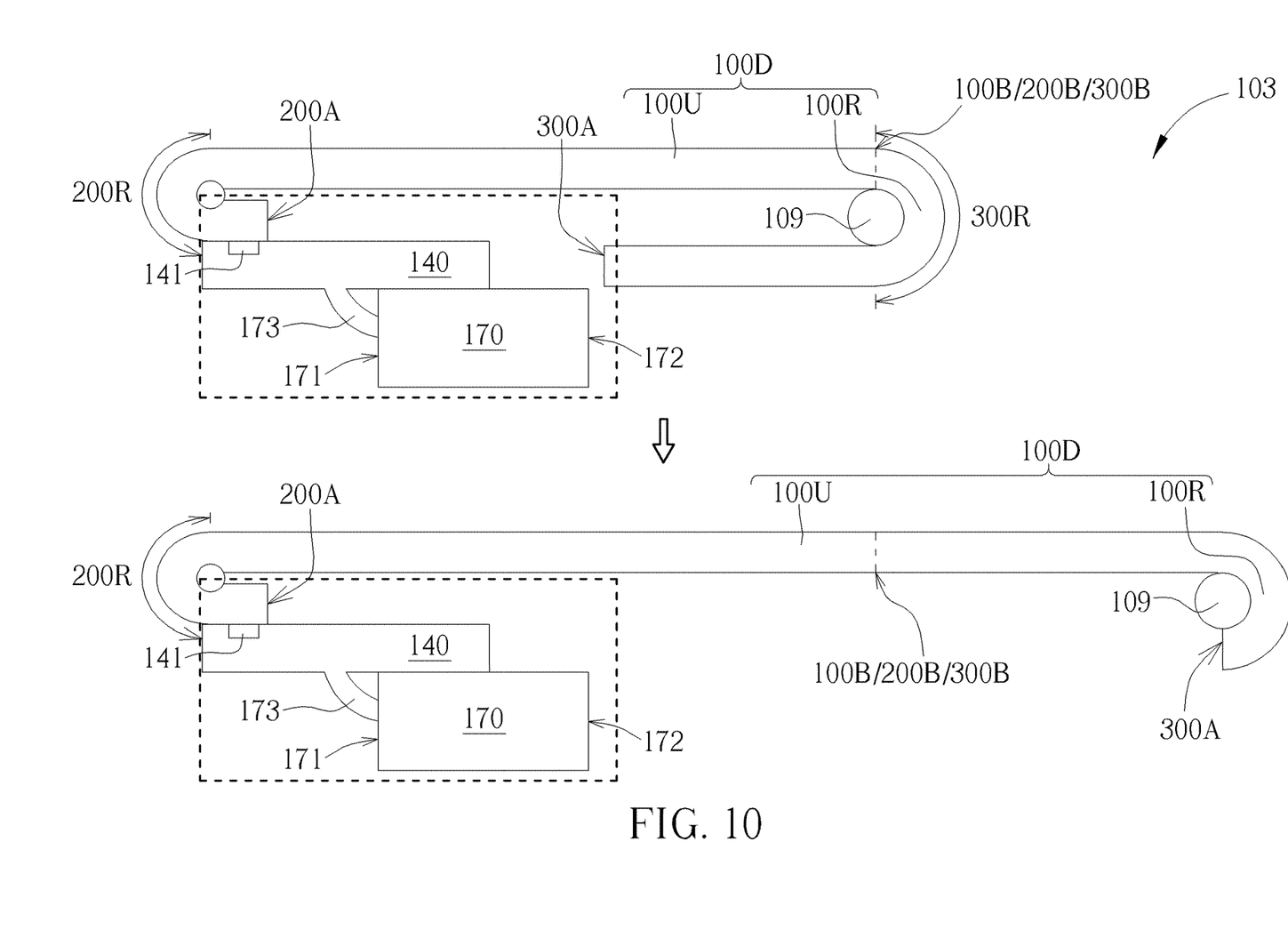
FIG. 10 is a schematic side view of a display device according to a seventh embodiment of the present disclosure.

FIG. 10 is a schematic cross-sectional view of the display device 103 according to the seventh embodiment of the present disclosure. The lower right side of FIG. 10 shows an unrolled state of the rollable portion 100R. According to the display device 103 of the seventh embodiment of the present disclosure, the display device 103 may further include a battery 170. The battery 170 may include a first side 171 and a second side 172. The first side 171 is closer to the end 200A of the non-rollable portion 100U, and the second side 172 is closer to the end 300A of the rollable portion 100R. The battery 170 may be electrically connected to the circuit board 140 via the wire 173 to provide power required for driving the rollable display panel 100D. The display panel 100D often needs repeated rolling and unrolling during its use. In some embodiments, as shown by the hollow arrow, the distance between the end 300A of the rollable portion 100R and the second side 172 of the battery 170 may become larger when the rollable portion 100R is unrolled. On the other hand, the distance between the end 300A of the rollable portion 100R and the second side 172 of the battery 170 becomes smaller when the rollable portion 100R is rolled. In other words, the distance between the end 300A of the rollable portion 100R and the second side 172 of the battery 170 may be variable, and the size may be changable as the rollable display panel 100D is rolled or unrolled during its use. In some embodiments, the relative position between the end 200A of the non-crimping portion 100U and the battery 170 may be unchangable. For example, the distance between the end 200A of the non-rollable portion 100U and the first side 171 of the battery 170 may remain unchanged when the rollable portion 100R is unrolled. On the other hand, the distance between the end 200A of the non-rollable portion 100U and the first side 171 of the battery 170 still remains unchanged when the rollable portion 100R is rolled. In other words, the distance between the end 200A of the non-rollable portion 100U and the first side 171 of the battery 170 does not change along with the unrolled state or the rolled state of the rollable display panel 100D during its use.

According to the rollable display device of the embodiments of the present disclosure, the non-rollable portion may be connected to the rollable portion and may be connected to a circuit board. This design may make the rollable display device of the embodiments of the present disclosure go with users' habits, or reduce the number of changes in size. In this way, the accuracy of the signal input during the repeated rolling and unrolling of the display panel may be increased, so that the service life of the display device with an extendable display area may be increased, or the reliability of the rollable display device may be increased.

Those skilled in the art will readily observe that numerous modifications and alterations of the device and method may be made while retaining the teachings of the present disclosure. Accordingly, the above disclosure should be construed as limited only by the metes and bounds of the appended claims.

What is claimed is:
1. A display device, comprising:
   a display panel comprising a rollable portion and a non-rollable portion; and
   a circuit board fixed onto a back of the display panel;
   wherein, the non-rollable portion has two ends and a first region, one of the two ends is connected to the rollable portion, the other of the two ends is connected to the circuit board, and the first region adjacent to the other of the two ends.

2. The display device of claim 1, wherein the non-rollable portion has a second region and a bending region, and the bending region is disposed between the first region and the second region.

3. The display device of claim 2, wherein the circuit board comprises a bonding pad, and a distance d between the bonding pad and the bending region is not less than 1000 µm.

4. The display device of claim 1, wherein the circuit board has a first region which is joined to the first region of the non-rollable portion.

5. The display device of claim 4, wherein the display panel has a non-display side, and the circuit board has a second region, and the second region is fixed on the non-display side.

6. The display device of claim 4, further comprising:
a housing for accommodating the display panel and the circuit board, and the circuit board has a second region fixed to the housing.

7. The display device of claim 1, further comprising:
a battery electrically connected to the circuit board and a distance between an end of the non-rollable portion connected to the circuit board and the battery does not change along with a unrolled state or with a rolled state of the display panel.

8. A display device, comprising:
a display panel comprising a rollable portion and a non-rollable portion, wherein the non-rollable portion has a first region; and
a circuit board fixed onto a back of the display panel, wherein the circuit board has a first region which is joined to the first region of the non-rollable portion;
wherein, the non-rollable portion has two ends, one of the two ends is connected to the rollable portion, and the other of the two ends is connected to the circuit board.

9. The display device of claim 8, wherein the first region of the non-rollable portion adjacent to the other of the two ends.

10. The display device of claim 9, wherein the non-rollable portion has a second region and a bending region, and the bending region is disposed between the first region of the non-rollable portion and the second region.

11. The display device of claim 10, wherein the circuit board comprises a bonding pad, and a distance d between the bonding pad and the bending region is not less than 1000 µm.

12. The display device of claim 8, wherein the display panel has a non-display side, and the circuit board has a second region, and the second region is fixed on the non-display side.

13. The display device of claim 8, further comprising:
a housing for accommodating the display panel and the circuit board, and the circuit board has a second region fixed to the housing.

14. The display device of claim 8, further comprising:
a battery electrically connected to the circuit board and a distance between an end of the non-rollable portion connected to the circuit board and the battery does not change along with a unrolled state or with a rolled state of the display panel.

* * * * *